(12) United States Patent
Jeon et al.

(10) Patent No.: US 6,255,144 B1
(45) Date of Patent: Jul. 3, 2001

(54) REPAIRING FUSE FOR SEMICONDUCTOR DEVICE AND METHOD FOR FABRICATING THE SAME

(75) Inventors: Bae Keun Jeon, Yicheon; Myeung Sik Chang; Choon Sik Oh, both of Seoul; Sung Wook Park, Yicheon, all of (KR)

(73) Assignee: Hyundai Electronics Industries, Co., Ltd., Gyunggi-do (KR)

( * ) Notice: Subject to any disclaimer, the term of this patent is extended or adjusted under 35 U.S.C. 154(b) by 0 days.

(21) Appl. No.: 09/327,617

(22) Filed: Jun. 8, 1999

(30) Foreign Application Priority Data

Jun. 10, 1998 (KR) .................................................. 98-21584

(51) Int. Cl.⁷ .................................................. H01L 21/82
(52) U.S. Cl. .......................................... 438/131; 438/467
(58) Field of Search ..................................... 438/131, 132, 438/215, 281, 333, 467, 600, 601

(56) References Cited

U.S. PATENT DOCUMENTS

| | | | | |
|---|---|---|---|---|
| 4,792,835 | * | 12/1988 | Sacarisen et al. | 357/23.6 |
| 5,793,094 | * | 8/1998 | Sanchez et al. | 257/530 |
| 5,970,346 | * | 10/1999 | Liaw | 438/281 |

FOREIGN PATENT DOCUMENTS

| | | |
|---|---|---|
| 4-300081 | 10/1992 | (JP) . |
| 4-355972 | 12/1992 | (JP) . |
| 7-74254 | 3/1995 | (JP) . |
| 9-312342 | 12/1997 | (JP) . |

* cited by examiner

Primary Examiner—David Nelms
Assistant Examiner—David Nhu
(74) Attorney, Agent, or Firm—Oliff & Berridge, PLC.

(57) ABSTRACT

Disclosed is a repairing fuse for semiconductor devices and fabrication therefor. The repairing fuse has a first conducting film and a plurality of second conducting films wherein the first conducting film and the second conducting films are initially disconnected and mutually connected upon illumination of a laser beam so as to repair the semiconductor devices. In a contact hole which has a lower part narrower than its upper part, the first conducting film is formed having a connection to a bottom wire layer atop a semiconductor substrate. The contact hole is formed in an interlayer insulating film deposited on the wire layer. The second conducting films are disconnected with each other, each having an end point at a predetermined part on the slant wall the upper part of the contact hole. This novel fuse concept eliminates conventional problems, bringing a significant improvement into the simplification and yield of a repairing process.

6 Claims, 5 Drawing Sheets

REPAIRING FUSE FOR SEMICONDUCTOR DEVICE AND METHOD FOR FABRICATING THE SAME

BACKGROUND OF THE INVENTION

1. Field of the Invention

The present invention relates to a repairing fuse for semiconductor devices. More particularly, the present invention relates to a fuse whose repairing mechanism is conducted in such a way that it is connected with another fuse, instead of being destroyed. Also, the present invention is concerned with a method for fabricating such a repairing fuse.

2. Description of the Prior Art

In semiconductor memory devices, redundancy cells are generally provided by sub-array blocks. For instance, to substitute for defective memory cells by row/column units, redundant rows and columns are prepared in every 256K cell aeries. Typically, after completion of wafer scale integration, testing is conducted to select defective memory cells. If any defective memory cell is detected, programming is executed in the internal circuit to convert its address into that of a corresponding redundancy cell through a repair circuit. Accordingly, if the address corresponding to a defective line is input, the line of the redundancy cells is selected and works in practical use.

Usually, the programming is conducted in an electric fusing technique in which an overcurrent is used to melt a fuse till it disconnects or in a laser beam fusing technique in which a laser beam is used to incapacitate a fuse. Of these techniques, the laser beam fusing technique is preferred by virtue of its simplification and reliability in addition to its ability to be easily laid out. However, this technique suffers from disadvantages in that a control is required to leave an appropriate thickness of a residual oxide on a single layer or multilayer polysilicon structure which is used as a fuse and that the oxide in a small sized fuse box should be etched to a deep extent upon repair (or pad) etching. Another disadvantage of the laser beam fusing technique is that the size of the fuse is inconveniently adjusted to the focal size of the laser beam when shrunk.

SUMMARY OF THE INVENTION

Therefore, it is an object of the present invention to overcome the above problems encountered in prior arts and to provide a repairing fuse for semiconductor devices, which allows the simplification of a repairing process with an improvement in the yield.

It is another object of the present invention to provide a method for fabricating such a fuse.

In accordance with an embodiment of the present invention, there is provided a repairing fuse for semiconductor devices, comprising: a first conducting film which is formed in a contact hole with a connection to a bottom wire layer atop a semiconductor substrate, the contact hole having a lower part narrower than its upper part and being formed in an interlayer insulating film deposited on the wire layer; and a plurality of second conducting films which are disconnected with each other, each having an end point at a predetermined part of the slant wall of the contact hole, wherein the first conducting film and the second conducting films are mutually connected upon illumination of a laser beam so as to repair the semiconductor devices.

In order to fabricate such a repairing fuse, there is provided a method, comprising the steps of: forming an interlayer insulating film on a planarized surface of a bottom wire layer atop a semiconductor substrate; opening the insulating film to form a contact hole through which a predetermined region is exposed, the contact hole having a lower part narrower than its upper part; filling a first conducting film in the narrow lower part of the contact hole, the first conducting film being in contact with the bottom wire layer; and forming second conducting film patterns, which are disconnected with each other at a region atop the first conducting film with an end point at a predetermined part on the slant wall of the upper part of the contact hole. Optionally, following this, the method may further comprises the steps of: depositing an insulating film over the resulting structure; selectively etching the insulating film with the aid of a repairing mask pattern to expose the first conducting film and the second conducting film; and illuminating a laser beam on the first conducting film and the second conducting film to connect them mutually.

In accordance with another embodiment of the present invention, there is provided a repairing fuse for semiconductor devices, comprising disconnected conducting patterns each of which is formed over an interlayer insulating film, filling a contact hole with a connection to a bottom wire pattern, the contact hole having a lower part narrower than its upper part and being formed in the interlayer insulating film deposited on the wire layer atop a semiconductor substrate, wherein the disconnected conducting patterns are connected mutually upon illumination of a laser beam so as to repair the semiconductor devices.

In order to fabricate such a repairing fuse, there is provided a method, comprising the steps of: depositing an interlayer insulating film on a planarized surface of bottom wire patterns formed on a semiconductor substrate; constructing in the interlayer insulating film contact holes which each has a narrower diameter in a lower part than in an upper part and exposes a predetermined area of the bottom wire patterns therethrough; and forming conducting patterns in the contact holes with connections to the bottom wire patterns, the conducting patterns being disconnected with each other and extending over the interlayer insulating film. Optionally, following this, the method may further comprise the steps of: depositing an insulating film over the resulting structure; selectively etching the insulating film with the aid of a repairing mask pattern to expose the conducting patterns; and illuminating a laser beam on the conducting patterns to connect them mutually.

In the present invention, a contact hole process and a wiring process are, in sequence, conducted, resulting in the formation of a fuse consisting of a conducting film filled in the contact hole and a conducting film on an interlayer insulating film. These two conducting films are in a disconnection state and, when illumination of a laser beam, are connected with each other for repairing.

BRIEF DESCRIPTION OF THE DRAWINGS

The above and other objects and aspects of the invention will become apparent from the following description of embodiments with reference to the accompanying drawings in which.

DETAILED DESCRIPTION OF THE PREFERRED EMBODIMENTS

Figure 1A:
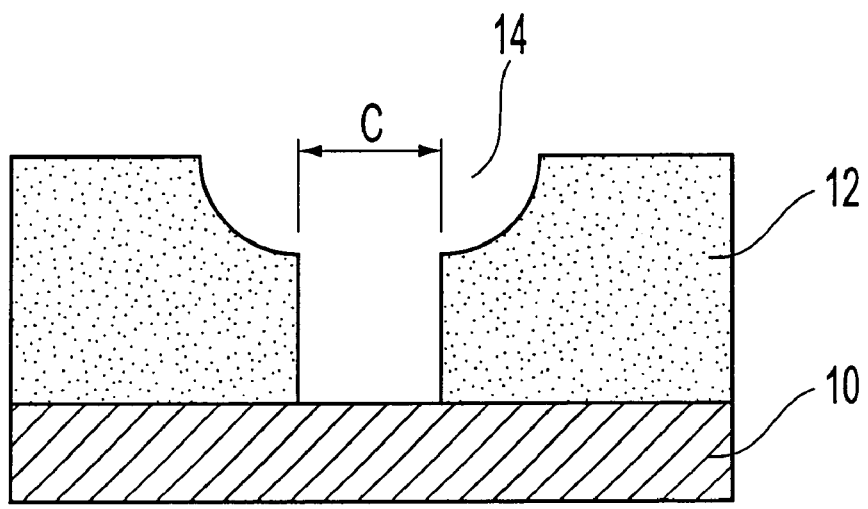
FIGS. 1a through 1d are schematic views stepwise illustrating a method for fabricating a repairing fuse for semiconductor devices, in accordance with an embodiment of the present invention.

The application of the preferred embodiments of the present invention is best understood with reference to the accompanying drawings, wherein like reference numerals are used for like and corresponding parts, respectively.

Referring to FIG. 1, there are process diagrams showing the fabrication of a fuse for semiconductor devices, in accordance with an embodiment of the present invention.

First, as shown in FIG. 1a, over a bottom wire layer 10 atop a silicon substrate (not shown) are, in sequence, deposited a boro-phosphorous silicate glass (BPSG) layer, a silicon oxide glass (SOG) layer and a BPSG layer which are then subjected to chemical mechanical polishing (CMP) for surface planarization to form an interlayer insulating film 12, followed by selectively etching the interlayer insulating film 12 in a photo-etching process to form a contact hole 14. In this regard, a wet etching technique is first applied to etch the interlayer insulating film 12 to a small degree and then, a dry etching technique is used until a predetermined region of the bottom wire layer 10 is exposed. In result, the contact hole 14 has a lower part C narrower than its upper part.

Figure 1B:
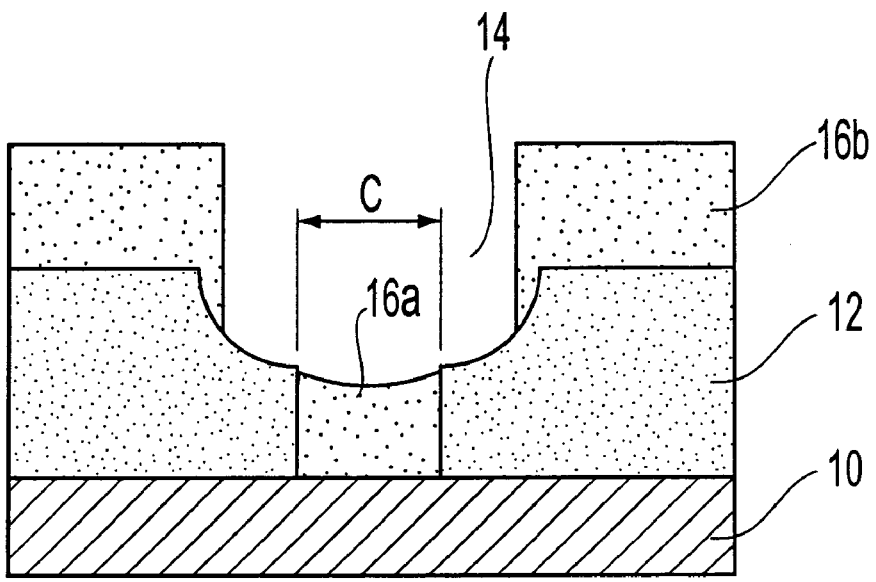

Thereafter, as shown in FIG. 1b, a metal layer is entirely deposited over the resulting structure including the contact hole 14 to fill the narrow part C and thermally treated to form a first conducting film 16a which is connected to the bottom wire 10. Next, after being thickly deposited over the resulting structure, a metal layer is photo-etched to form a second conducting film 16b in such a pattern that it is disconnected at a region atop the first conducting film 16a with an end point at a predetermined part of the slant wall of the contact hole 14.

Composing a fuse, the first conducting film 16a and the second conducting film 16b are used to repair a device as follows.

Figure 1C:
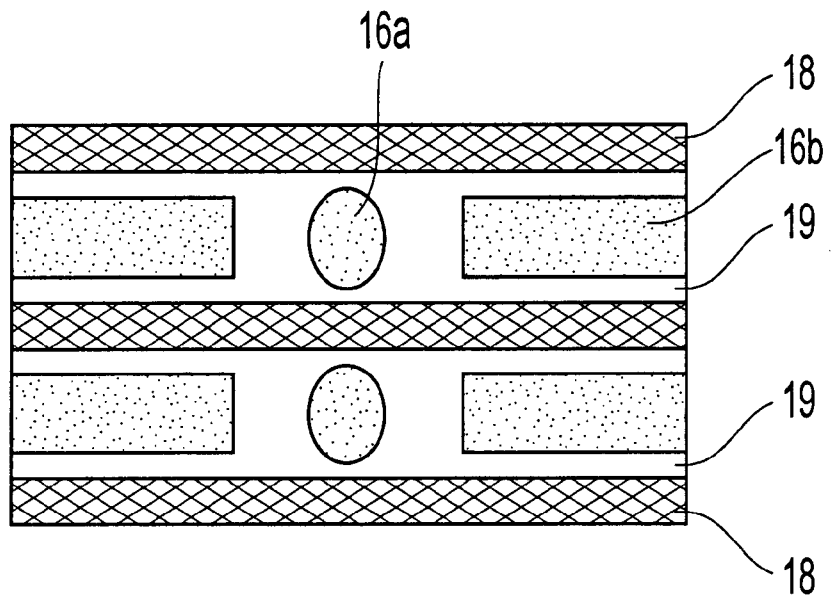
Figure 1D:
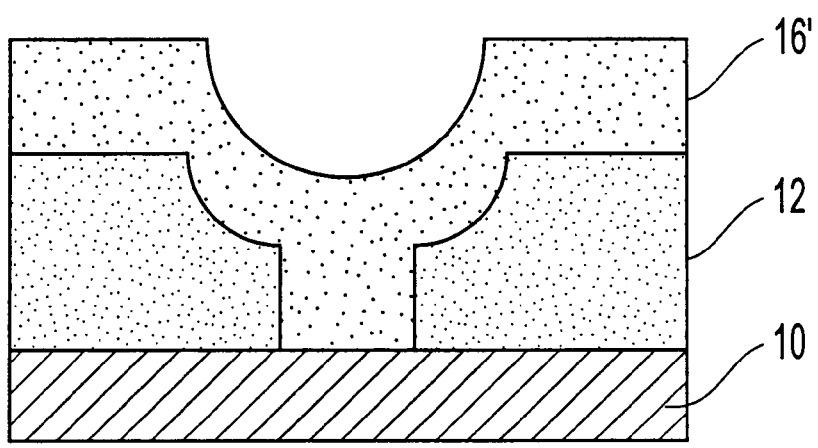

FIG. 1c is a schematic plan view after an insulating film 18 is deposited entirely over the resulting structure of FIG. 1b and a repairing/pad mask pattern 19 is formed with the aid of a photo process, followed by etching the insulating film 18 in alignment with the mask pattern 19 to expose the first conducting film 16a and the second conducting film 16b. Later, the insulating film 18 serves to protect the device upon the illumination of a laser beam.

Subsequently, a laser beam is illuminated on the first conducting film 16a and the second conducting film 16b to melt them, so that they connect with each other to form a fusing connected conducting film 16'.

Figure 2A:
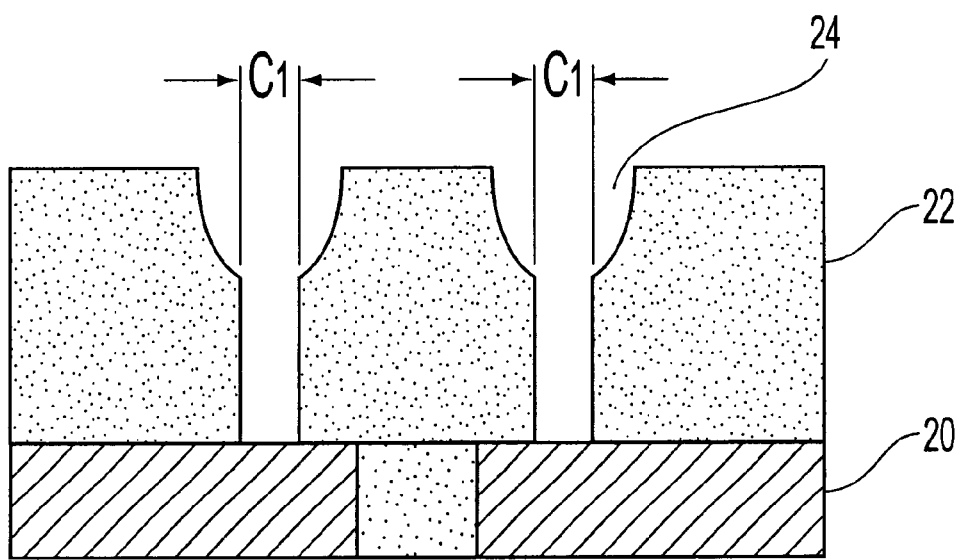
FIGS. 2a through 2c are schematic cross-sectional views stepwise illustrating a method for fabricating a repairing fuse for semiconductor devices, in accordance with another embodiment of the present invention.
Figure 2B:
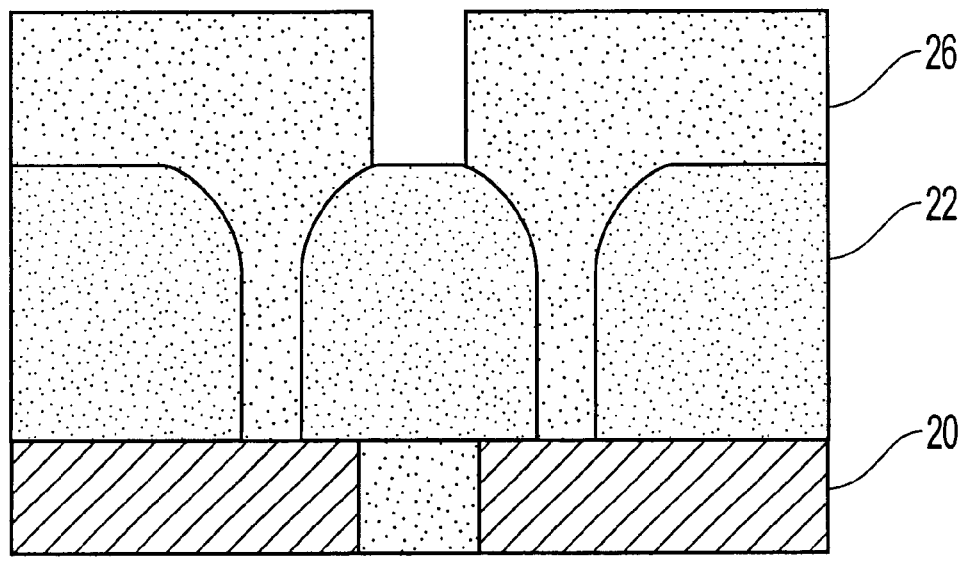
Figure 2C:
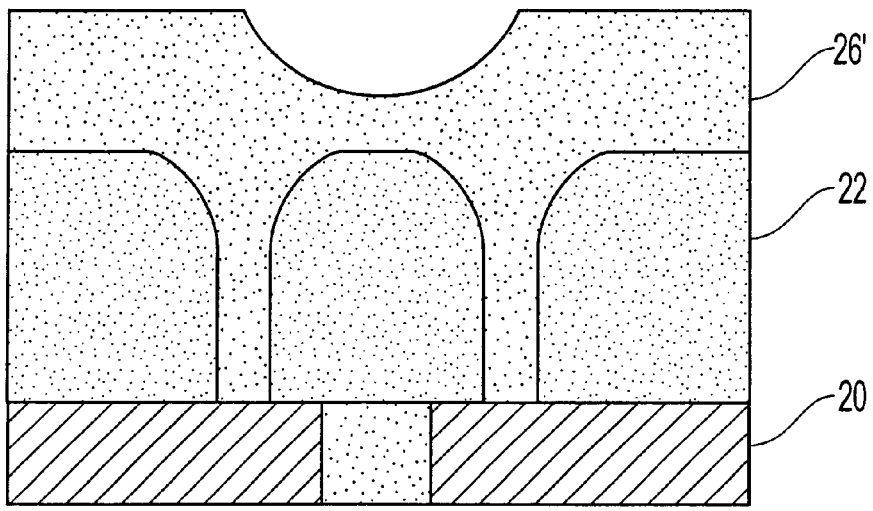

Turning now to FIG. 2, there is illustrated another embodiment of the present invention.

Initially, as shown in FIG. 2a, on a planarized surface of bottom wire patterns 20 atop a silicon substrate (not shown) is deposited an interlayer insulating film 22, after which a photo and etch process is conducted to form in the interlayer insulating film 22 contact holes 24, each having a narrower lower part $C_1$ than its upper part, through which predetermined areas of the bottom wire patterns 20 are exposed.

Subsequently, over the insulating film 22 in which the contact holes 24 are formed, as shown in FIG. 2b, a metal is deposited thickly enough to fill the contact holes 24, and subjected to thermal treatment, followed by applying a photo and etch process to the metal layer to form conducting patterns 26 which are separated from each other with a connection to the bottom wire patterns 20. Composing a fuse, the mutually separated conducting patterns 26 undergo the same repair procedure as that of the previous embodiment. As a result, the patterns 26 are connected to form a fuse-connected conducting film 26'.

Figure 3A:
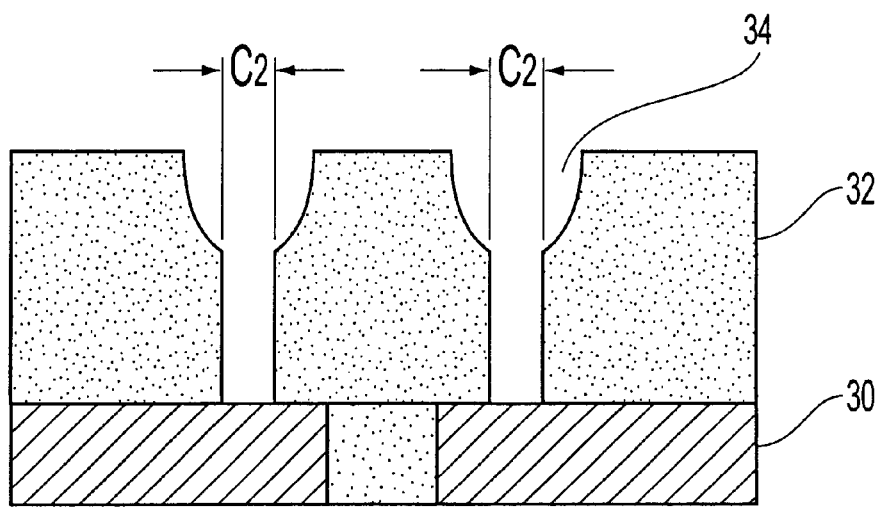
FIGS. 3a through 3c are schematic cross-sectional views stepwise illustrating a method for fabricating a repairing fuse for semiconductor devices, in accordance with a further embodiment of the present invention.
Figure 3B:
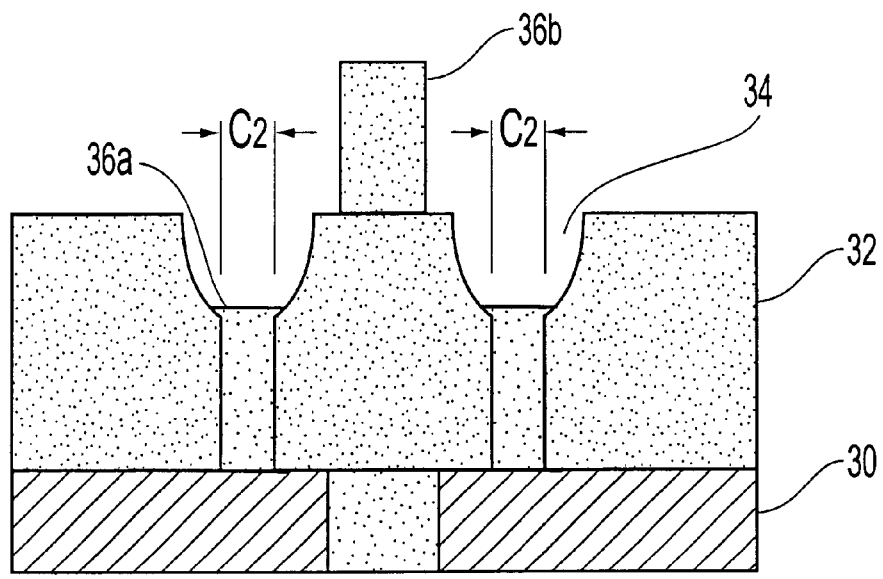
Figure 3C:
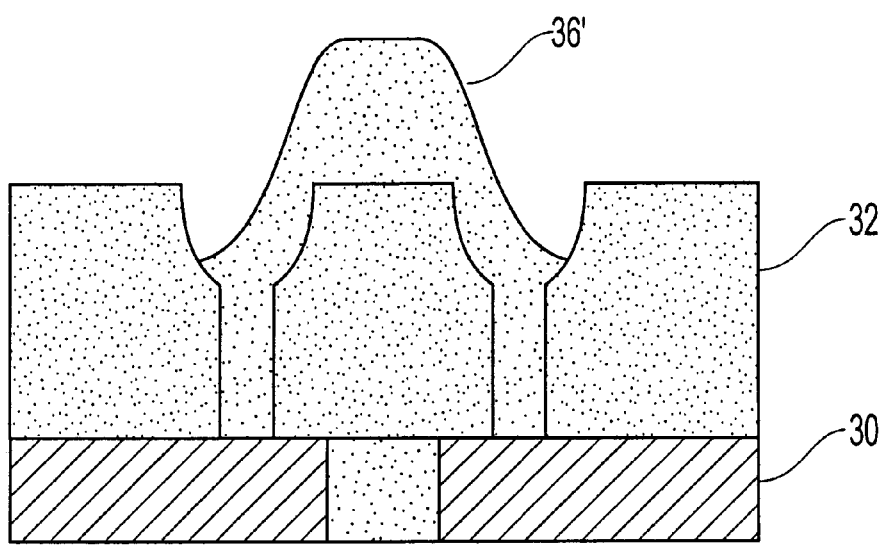

With reference to FIG. 3, there are process diagrams showing the fabrication of a fuse for semiconductor devices, in accordance with a further embodiment of the present invention, with similarity to the procedure illustrated in FIG. 1.

As shown in FIG. 3a, on a planarized surface of bottom wire patterns 30 atop a silicon substrate (not shown) is deposited an interlayer insulating film 32, after which a photo and etch process is conducted to form in the interlayer insulating film 32 contact holes 34, each having a narrower lower part $C_2$ than its upper part, through which predetermined areas of the bottom wire patterns 30 are exposed.

Thereafter, as shown in FIG. 3b, over the insulating film 32 in which the contact holes 34 are formed, as shown in FIG. 3b, a metal is deposited to fill the narrow parts $C_2$ of the contact holes 34, resulting in the formation of first conducting films 36a which are in contact with the lower wire patterns 30. Next, after being thickly deposited over the resulting structure, a metal layer is patterned by use of a photo and etch technique to form a second conducting film 36b on the interlayer insulating film 32 between neighboring two contact holes 34.

Also, the first conducting film 36a and the second conducting film 36b compose a fuse which is used to repair devices by following the repairing process illustrated above. A fuse-connected conducting film 36' is formed, which results from the connection of the first conducting film 36a with the second conducting film 36b.

As described hereinbefore, conducting films which are different in step and disconnected with each other are formed in and near contact holes and then, mutually connected by a laser beam for repairing. This novel concept according to the present invention eliminates the problems conventional fuse cutting techniques suffer from, for example, the requirements for leaving a suitable thickness of a residual oxide on a fuse, for deep etching an oxide in a small sized fuse box upon repair (or pad) etching, and for adjusting the fuse size to the focal size of a laser beam upon shrinking. Therefore, the present invention can bring a significant improvement into the simplification and yield of a repairing process.

It is to be understood that the embodiments described herein are merely illustrative of the principles of the invention. Various modifications may be made thereto by persons skilled in the art which will embody the principles of the invention and fall within the spirit and scope thereof.

What is claimed is:

1. A repairing fuse for semiconductor devices, comprising:
    a first conducting film which is formed in a contact hole with a connection to a bottom wire layer atop a semiconductor substrate, said contact hole having a lower part narrower than its upper part and being formed in an interlayer insulating film deposited on said wire layer; and
    a plurality of second conducting films which are disconnected with each other, each having an end point at a predetermined part of the slant wall of said contact hole, wherein said first conducting film and said second conducting films are mutually connected upon illumination of a laser beam so as to repair the semiconductor devices.

2. A method for fabricating a repairing fuse for semiconductor devices, comprising the steps of:

forming an interlayer insulating film on a planarized surface of a bottom wire layer atop a semiconductor substrate;

opening the insulating film to form a contact hole through which a predetermined region is exposed, said contact hole having a lower part narrower than its upper part;

filling a first conducting film in the narrow lower part of the contact hole, said first conducting film being in contact with said bottom wire layer; and forming second conducting film patterns, which are disconnected with each other at a region atop the first conducting film with an end point at a predetermined part on the slant w all of the upper part of the contact hole.

3. A method as set forth in claim 2, further comprising the steps of:

depositing an insulating film over the resulting structure of claim 2;

selectively etching said insulating film with the aid of a repairing mask pattern to expose said first conducting film and said second conducting film; and illuminating a laser beam on said first conducting film and said second conducting film to connect them mutually, after the second conducting film forming step.

4. A repairing fuse for semiconductor devices, comprising disconnected conducting patterns each of which is formed over an interlayer insulating film, filling a contact hole with a connection to a bottom wire pattern, said contact hole having a lower part narrower than its upper part and being formed in said interlayer insulating film deposited on said wire layer atop a semiconductor substrate, wherein said disconnected conducting patterns are connected mutually upon illumination of a laser beam so as to repair the semiconductor devices.

5. A method for fabricating a repairing fuse of semiconductor devices, comprising the steps of:

depositing an interlayer insulating film on a planarized surface of bottom wire patterns formed on a semiconductor substrate;

constructing in said interlayer insulating film contact holes which each has a narrower diameter in a lower part than in an upper part and exposes a predetermined area of said bottom wire patterns therethrough; and forming conducting patterns in said contact holes with connections to the bottom wire patterns, said conducting patterns being disconnected with each other and extending over said interlayer insulating film.

6. A method as set forth in claim 5, further comprising the steps of:

depositing an insulating film over the resulting structure of claim 5;

selectively etching said insulating film with the aid of a repairing mask pattern to expose said conducting patterns; and illuminating a laser beam on said conducting patterns to connect them mutually, after the conducting pattern forming step.

* * * * *